United States Patent
Leavitt et al.

(10) Patent No.: US 8,907,307 B2
(45) Date of Patent: Dec. 9, 2014

(54) APPARATUS AND METHOD FOR MASKLESS PATTERNED IMPLANTATION

(75) Inventors: Christopher J. Leavitt, Gloucester, MA (US); Ludovic Godet, Boston, MA (US); Timothy J. Miller, Ipswich, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 39 days.

(21) Appl. No.: 13/046,239

(22) Filed: Mar. 11, 2011

(65) Prior Publication Data
US 2012/0228515 A1 Sep. 13, 2012

(51) Int. Cl.
*H01J 3/14* (2006.01)
*H01J 37/302* (2006.01)
*H01J 37/317* (2006.01)
*H01J 37/32* (2006.01)

(52) U.S. Cl.
CPC ......... *H01J 37/3172* (2013.01); *H01J 37/3023* (2013.01); *H01J 37/32376* (2013.01); *Y02E 10/52* (2013.01); *H01J 37/32623* (2013.01); *H01J 37/32137* (2013.01); *H01J 37/32412* (2013.01); *H01J 37/32009* (2013.01); *H01J 2237/31711* (2013.01)
USPC .............. 250/492.23; 250/492.2; 250/492.21; 250/492.3

(58) Field of Classification Search
CPC ............ H01J 37/3172; H01J 37/32623; H01J 37/32009; H01J 37/32376; H01J 37/32137
USPC ................. 250/492.1, 492.2, 492.22, 492.23, 250/492.3
See application file for complete search history.

(56) References Cited

U.S. PATENT DOCUMENTS

| | | | | |
|---|---|---|---|---|
| 4,713,585 A * | 12/1987 | Ohno et al. | ............... | 315/111.81 |
| 5,583,344 A * | 12/1996 | Mizumura et al. | ....... | 250/492.21 |
| 5,825,035 A * | 10/1998 | Mizumura et al. | ........ | 250/423 R |
| 6,083,363 A * | 7/2000 | Ashtiani et al. | .......... | 204/298.01 |
| 6,750,462 B2 * | 6/2004 | Iwasawa et al. | ............ | 250/492.3 |
| 7,375,354 B2 * | 5/2008 | Iwasawa et al. | ......... | 250/492.21 |
| 7,442,946 B2 * | 10/2008 | Lee | ........................... | 250/492.21 |
| 7,670,455 B2 * | 3/2010 | Keller et al. | ............. | 156/345.48 |
| 7,750,320 B2 * | 7/2010 | Ferrara et al. | ............ | 250/492.21 |
| 7,804,068 B2 * | 9/2010 | Notte, IV | ...................... | 250/309 |
| 7,875,867 B2 * | 1/2011 | Hershkowitz et al. | ..... | 250/492.3 |
| 7,947,129 B2 * | 5/2011 | Murata et al. | .................. | 134/1.1 |

(Continued)

OTHER PUBLICATIONS

Liu, Cheng-Sen, et al., "Non-Uniformity of Ion Implantation in Direct-Current Plasma Immersion Ion Implantation" Chin. Phys. Lett. vol. 27m No. 7 (2010) 075201.*

(Continued)

*Primary Examiner* — Nicole Ippolito
*Assistant Examiner* — Wyatt Stoffa

(57) ABSTRACT

A method of implanting a workpiece in an ion implantation system. The method may include providing an extraction plate adjacent to a plasma chamber containing a plasma, such that the extraction plate extracts ions from the plasma through at least one aperture that provides an ion beam having ions distributed over a range of an angles of incidence on the workpiece. The method may include scanning the workpiece with respect to the extraction plate and varying a power level of the plasma during the scanning from a first power level to a second power level, wherein at a surface of the workpiece, a first beam width at a first power level is greater than a second beam width at a second power level.

19 Claims, 6 Drawing Sheets

(56) References Cited

U.S. PATENT DOCUMENTS

| | | | |
|---|---|---|---|
| 8,288,741 B1* | 10/2012 | Miller et al. | 250/492.21 |
| 2003/0160190 A1* | 8/2003 | Kawaguchi | 250/492.21 |
| 2006/0198965 A1* | 9/2006 | Tudhope et al. | 427/569 |
| 2006/0283549 A1* | 12/2006 | Aramaki et al. | 156/345.28 |
| 2006/0289800 A1* | 12/2006 | Murrell et al. | 250/492.21 |
| 2007/0087574 A1 | 4/2007 | Gupta et al. | |
| 2008/0053818 A1* | 3/2008 | Ui | 204/164 |
| 2008/0061251 A1* | 3/2008 | Burgess et al. | 250/492.21 |
| 2008/0067430 A1* | 3/2008 | Hershkowitz et al. | 250/492.3 |
| 2008/0200015 A1* | 8/2008 | Miller et al. | 438/510 |
| 2008/0290266 A1* | 11/2008 | Horsky et al. | 250/281 |
| 2009/0001290 A1* | 1/2009 | Yamashita | 250/492.3 |
| 2009/0001890 A1 | 1/2009 | Singh et al. | |
| 2009/0004836 A1* | 1/2009 | Singh et al. | 438/513 |
| 2009/0068769 A1* | 3/2009 | Okumura et al. | 438/10 |
| 2009/0078890 A1* | 3/2009 | Yamashita et al. | 250/492.3 |
| 2009/0140176 A1* | 6/2009 | Hershkowitz et al. | 250/492.3 |
| 2009/0200461 A1* | 8/2009 | Raj et al. | 250/287 |
| 2009/0309041 A1* | 12/2009 | Kurunczi et al. | 250/423 R |
| 2009/0317937 A1 | 12/2009 | Gupta et al. | |
| 2010/0084980 A1* | 4/2010 | Koo | 315/111.41 |
| 2010/0181499 A1* | 7/2010 | Vanderberg et al. | 250/492.3 |
| 2010/0255665 A1* | 10/2010 | Godet et al. | 438/513 |
| 2010/0255683 A1* | 10/2010 | Godet et al. | 438/710 |
| 2010/0294648 A1* | 11/2010 | Keller et al. | 204/192.11 |
| 2010/0303877 A1* | 12/2010 | Timmons et al. | 424/405 |
| 2010/0323508 A1* | 12/2010 | Adibi et al. | 438/513 |
| 2011/0086501 A1* | 4/2011 | Papasouliotis et al. | 438/514 |
| 2011/0100800 A1* | 5/2011 | Gorokhovsky | 204/192.12 |
| 2011/0124186 A1* | 5/2011 | Renau et al. | 438/513 |
| 2011/0248633 A1* | 10/2011 | Nauman et al. | 315/111.21 |
| 2011/0253902 A1* | 10/2011 | Godet et al. | 250/424 |
| 2011/0266957 A1* | 11/2011 | Stamate | 315/111.81 |
| 2011/0281440 A1* | 11/2011 | Porshnev | 438/762 |
| 2011/0309049 A1* | 12/2011 | Papasouliotis et al. | 216/37 |
| 2012/0076475 A1* | 3/2012 | Horsky et al. | 392/386 |
| 2012/0082292 A1* | 4/2012 | Zou et al. | 378/16 |
| 2012/0145918 A1* | 6/2012 | Radovanov et al. | 250/424 |

OTHER PUBLICATIONS

Liu, Cheng-Sen, et al., "Non-Uniformity of Ion Implantation in Direct-Current Plasma Immersion Ion Implantation" Chin. Phys. Lett. vol. 27m No. 7 (2010) 075201 [Liu] is not used as prior art, but rather as a document providing evidence for inherency.*

* cited by examiner

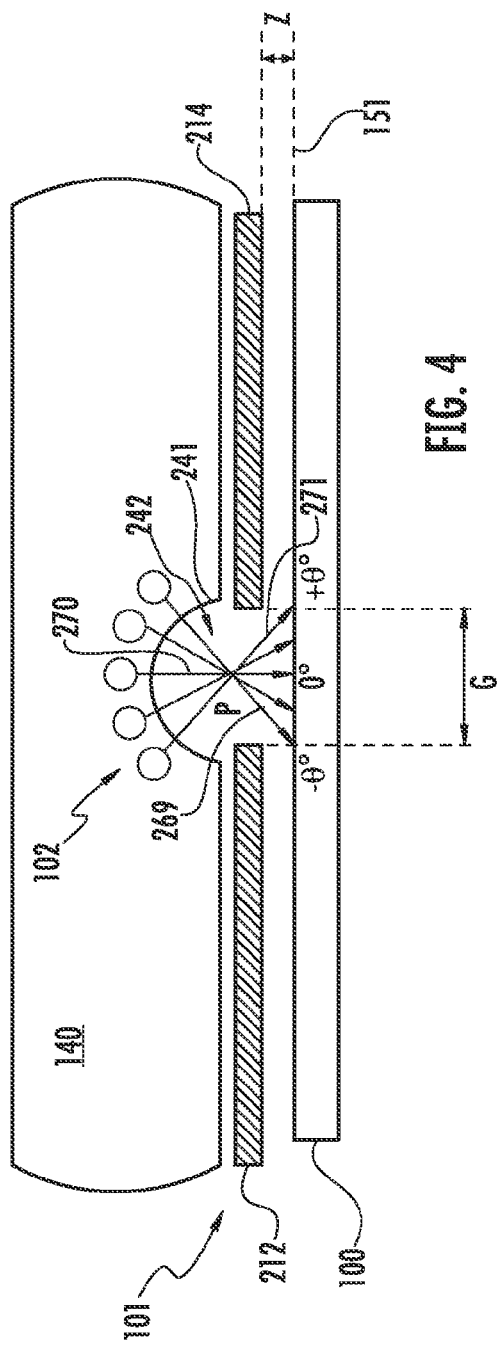
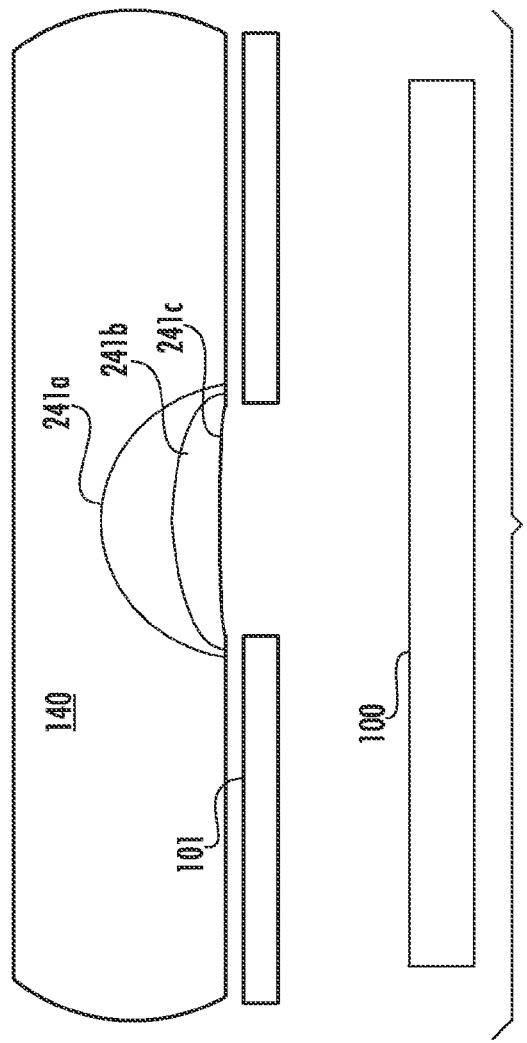
FIG. 4
FIG. 5

APPARATUS AND METHOD FOR MASKLESS PATTERNED IMPLANTATION

FIELD

This invention relates to the implantation of workpieces and, more particularly, to a method and apparatus for variable implantation of workpieces.

BACKGROUND

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

High dose implantation may allow the lowest cost-of-ownership for an ion implanter. Localized or selective doping or localized or selective material modification may be required for some implants. Fabrication of solar cells presents one example in which high dose implantation and selective doping of local areas is desirable. Doping, which may improve efficiency of solar cells, may be performed using ion implantation. FIG. 1 is a cross-sectional view of a selective emitter solar cell 10. It may increase efficiency (the percentage of light converted to electrical energy) of a solar cell to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 μm across. The solar cell 10 may also include an ARC layer 22, disposed above the emitter 200 and a base layer 24, as well as backside contact 26. FIG. 2 is a cross-sectional view of an interdigitated back contact (IBC) solar cell 20. In the IBC solar cell 20, the junction is on the back of the solar cell. The solar cell may have an arc layer 20, passivating layer 28, and N+ front surface field 30 that form a stack adjacent an N-type base layer 32. The doping pattern may include alternating p-type and n-type dopant regions in this particular example. The p+ emitter 203 and the n+ back surface field 204 may be doped. This doping may enable the junction in the IBC solar cell to function or have increased efficiency. The p-type contact fingers 34 and n-type contact fingers 36 may be formed in contact through holes 38 formed in passivating layer 40.

In manufacturing articles such as solar cells, the use of known patterning processes, such as photolithography, in conjunction with implantation, may be too cost prohibitive for use to perform selective area implantation because of the extra steps required.

Plasma doping technology is not fully tested for such applications. Direct exposure to neutrals in the plasma may cause deposition or etching of a workpiece and may require additional cleaning steps. Accordingly, there is a need in the art for an improved implantation of workpieces and, more particularly, to an improved method and apparatus for patterned implantation of workpieces without the use of masks.

SUMMARY

In one embodiment, a method of implanting a workpiece in an ion implantation system comprises providing an extraction plate adjacent to a plasma chamber containing a plasma, wherein the extraction plate is configured to provide an ion beam having ions distributed over a range of angles of incidence on the workpiece. The method include scanning the workpiece with respect to the extraction plate and varying a power level of the plasma during the scanning from a first power level to a second power level, wherein at a surface of the workpiece, a first beam width at a first power level is greater than a second beam width at a second power level.

In another embodiment, an ion implantation apparatus comprises a plasma source operable to vary plasma power of a plasma in a plasma chamber, wherein the plasma contains ions for implantation into a workpiece. The apparatus also includes an extraction plate having an aperture configured to modify a shape of a plasma sheath proximate the extraction plate, the extraction plate being scannable with respect to the workpiece in at least a first direction. The apparatus further includes a processing chamber containing a workpiece operable to receive a bias with respect to the plasma, wherein the plasma source and the extraction plate are interoperable to vary a width of the ion beam incident of the substrate by varying plasma power.

BRIEF DESCRIPTION OF THE DRAWINGS

For a better understanding of the present disclosure, reference is made to the accompanying drawings, which are incorporated herein by reference and in which:

FIG. 4 is a cross-sectional view of an exemplary focusing plate arrangement within a plasma system;

FIG. 5 depicts in a schematic fashion exemplary shapes of a plasma sheath boundary as a function of plasma power;

DETAILED DESCRIPTION

Embodiments of a system and method are described herein in connection with implantation of workpieces (substrates). In various embodiments, this system can be used with, for example, solar cell substrates, semiconductor substrates, bit-patterned media, solid-state batteries, polymer materials, flat panels, oxide substrates, and substrates comprising insulator material. Thus, the invention is not limited to the specific embodiments described below.

In various embodiments, an ion implantation system includes a plasma source, a plasma sheath modifier (also referred to as an extraction plate), and a mechanism for scanning the plasma source with respect to a workpiece. In some embodiments, the ion implantation system is operable to vary ion beam properties of an ion beam extracted from the plasma source and provided to the workpiece. In various embodiments, the ion beam properties may be varied in a repetitive fashion while a workpiece is scanned with respect to the ion beam. In some embodiments, the plasma source may be an RF-source whose applied power level (power setpoint) is periodically varied in order to modify the properties of an ion beam extracted through the plasma sheath modifier.

In various embodiments, a workpiece may be patterned with areas of differing widths and differing levels of implanted species by varying the power set point of an RF-source used to generate a plasma while a workpiece is scanned with respect to an extraction plate (also termed herein "plasma sheath modifier") that extracts an ion beam from the plasma.

Figure 1:
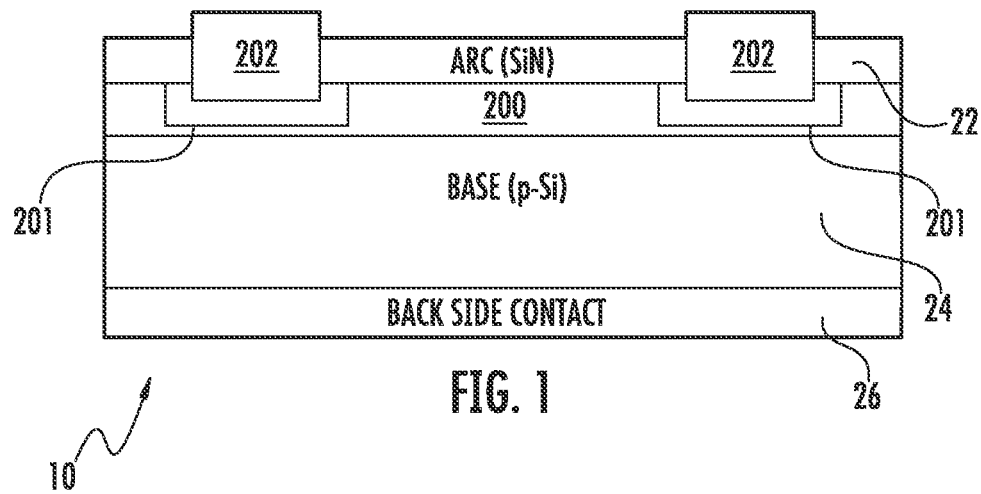
FIG. 1 is a cross-sectional view of a known selective emitter solar cell.
Figure 2:
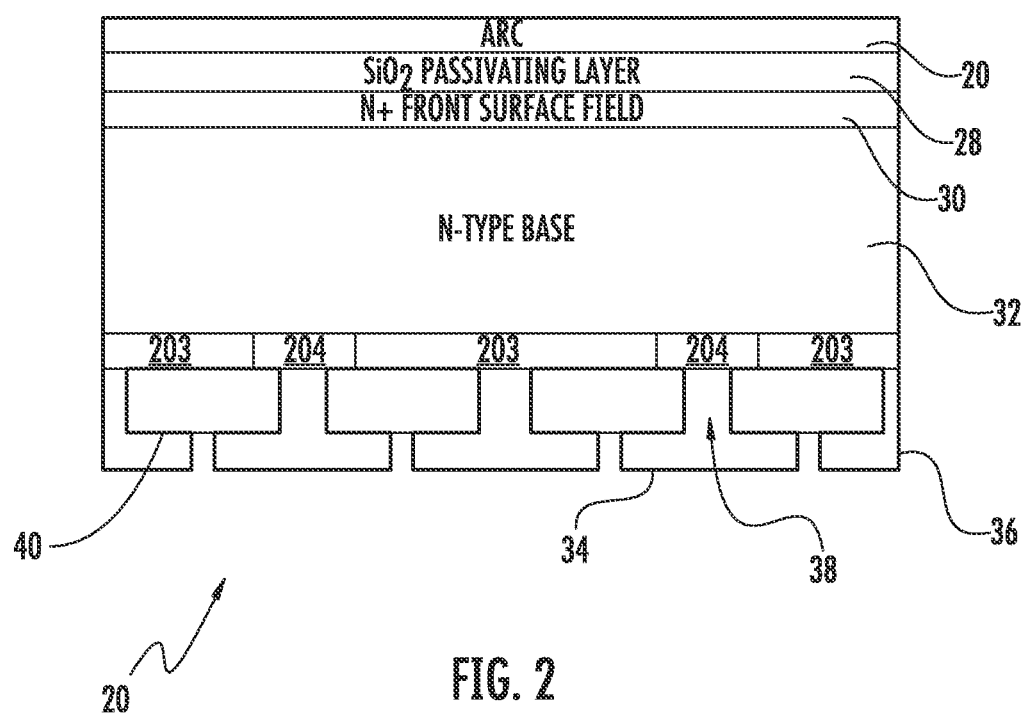
FIG. 2 is a cross-sectional view of a known interdigitated back contact solar cell.
Figure 3:
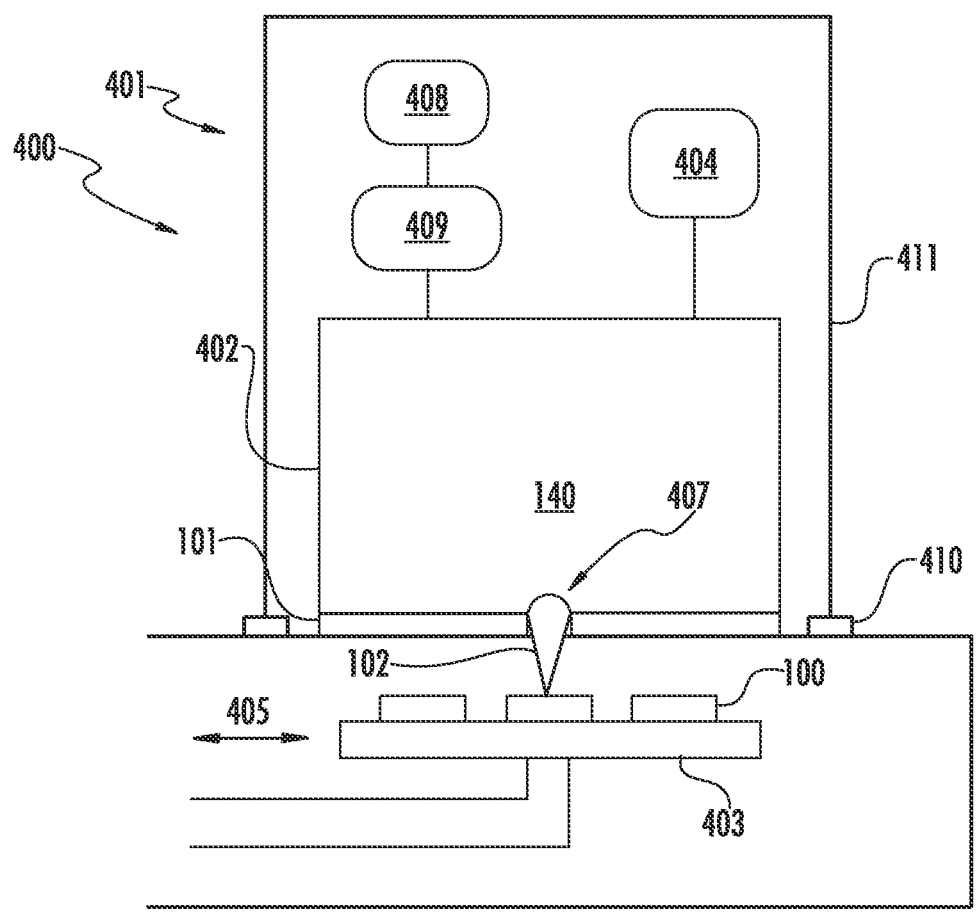
FIG. 3 is a block diagram of a plasma processing apparatus consistent with an embodiment of the disclosure.

FIG. 3 is a block diagram of a plasma processing apparatus consistent with an embodiment of the disclosure. The system 400 includes a plasma source 401, an extraction plate 101 (or sheath engineering plate), and a process chamber 402. A gas source 404 is connected to the plasma source 401. The plasma source 401 or other components of the system 400 also may be connected to a pump (not shown), such as a turbopump. The plasma source 401 that generates the plasma 140 may be, for example, an RF plasma source, inductively-coupled plasma (ICP) source, indirectly heated cathode (IHC), or other plasma sources known to those skilled in the art. In this particular embodiment, the plasma source 401 is an RF plasma source with an RF source generator 408 and an RF matching network 409. The plasma source 401 is surrounded by an enclosure 411 and a DC break 410 separates the enclosure 411 from the process chamber 402 in this particular embodiment. The process chamber 402, plasma source 401, or platen 403 may be grounded.

The extraction plate 101 is used to extract ions 102 for implantation into a workpiece 100. The extraction plate 101 may be cooled or heated. The plasma source 401 may be biased and a bias power supply (not shown) may be provided to provide a continuous or pulsed bias on the substrate with respect to the plasma 140 to attract the ions 406.

The extraction plate 101 may have at least one aperture 407, through which ions 102 are provided to substrate (workpiece) 100. The extraction plate 101 may be cooled or otherwise have its thermal characteristics controlled. The pressure in the plasma source 401 and the process chamber 402 may be approximately equal, which may cause arcing.

One or more workpieces 100, which may be solar cells or other devices, may be arranged on a platen 403 in the process chamber 402. The distance between the extraction plate 101 and the workpieces 100 may be controlled to compensate for any thermal expansion of the extraction plate 101. Workpieces 100 may be arranged in an array or matrix that is N workpieces 100 wide and N workpieces 100 long (where the "N" variable in the width dimension can be different from that in the length dimension). In FIG. 3, a matrix of 1×3 workpieces is illustrated. The platen 403 may use electrostatic clamping, mechanical clamping, or a combination of electrostatic and mechanical clamping to retain the workpieces 100. The workpieces 100 may be scanned using the platen 403. In the embodiment of FIG. 3, the platen 403 can scan in the direction 405. The platen 403, however, may perform either 1D or 2D scanning depending on the desired implant pattern on the workpieces 100. For example, 2D scanning may be performed to create spot-shaped or dot-shaped implant regions in the workpieces 100. In an alternate embodiment, the extraction plate 101 scans with respect to stationary workpieces 100. The platen 403 may be configured to provide backside gas cooling to the workpieces 100 in one instance.

The workpiece 100 may be heated or cooled to various temperatures before or during implantation using the platen 403 or some other apparatus.

As detailed further below, in various embodiments, during scanning of the extraction plate 101 and/or the workpieces 100 with respect to one another, changes in power of the plasma source 401 and/or pulsing of bias voltage between plasma 140 and substrate 100 may be performed to achieve the desired dose and distribution of ions across the workpieces 100. In some embodiments, the pulsing of bias voltage may be coupled with variations in plasma power setpoints to produce a desired implantation pattern in a substrate.

As suggested by FIG. 3, ions 102 extracted through extraction plate 101 may impinge on workpiece 100 over a range of angles in which the ion beam as a whole may focus to a smaller width than the aperture 407 from which the beam 102 is extracted. In accordance with various embodiments, the focusing of ions 102 may be controlled to vary implantation conditions at workpiece 100. In particular, the power in plasma source 401 may be varied to alter the size of a beam of ions 102 when it impacts workpiece 100.

FIG. 4 is a cross-sectional view of details of an extraction plate arrangement within a plasma system in accordance with one embodiment. The extraction plate 101 is configured to modify an electric field within the plasma sheath 242 to control a shape of a boundary 241 between plasma 140 and the plasma sheath 242. Accordingly, ions 102 that are attracted from the plasma 140 across the plasma sheath 242 may strike the workpiece 100 at a large range of incident angles.

The plasma 140 may be generated as described above with respect to FIG. 3. Extraction plate 101 may be a unitary plate having a slot or may be a pair of panels 212 and 214 defining a gap there between having a horizontal spacing (G). The panels 212 may be an insulator, semiconductor, or conductor. In various embodiments, the extraction plate 101 may include a multiplicity of gaps (not shown). Plate 101 may be positioned at a vertical spacing (Z) above the plane 151 defined by the front surface of the workpiece 100.

Ions 102 may be attracted from the plasma 140 across the plasma sheath 242 by different mechanisms. In one instance, the workpiece 100 is biased to attract ions 102 from the plasma 140 across the plasma sheath 242. The ions 102 may be a p-type dopant, an n-type dopant, hydrogen, a noble gas, or other species known to those skilled in the art.

Advantageously, the extraction plate 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 in one instance. When the workpiece 100 is biased, for example, the ions 102 are attracted across the plasma sheath 242 through the gap between the panels 212 and 214 at a large range of incident angles. For instance, ions following trajectory path 271 may strike the workpiece 100 at an angle of $+\theta°$ relative to the plane 151. Ions following trajectory path 270 may strike the workpiece 100 at about an angle of 0° relative to the same plane 151. Ions following trajectory path 269 may strike the workpiece 100 at an angle of $-\theta°$ relative to the plane 151. Accordingly, the range of incident angles may be between $+\theta°$ and $-\theta°$ centered about 0°. In addition, some ion trajectories such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (θ) may be between +60° and −60° centered about 0°.

In the example depicted in FIG. 4, ions extracted through extraction plate 101 may converge, cross paths with one another, and diverge from one another before impinging on workpiece 100. Although ions in FIG. 4 are depicted as passing through a focal point P, in some embodiments ions provided from an extraction plate need not define an exact focal point. However, in accordance with various embodiments, an extraction plate such as extraction plate 101, provides a beam of ions that generally converges. Referring again to FIG. 3, in accordance with some embodiments, and depending upon selected parameters of the plasma system 400, the ion beam may exhibit regions of convergence and/or divergence before impinging on a substrate. In particular, various embodiments control this ion beam convergence/divergence, which is also referred to herein as ion beam "focusing" or "focus," by controlling the power level (power set point) of the plasma in plasma system 400. In turn, by varying the focus of the ion beam while scanning a workpiece 100 with respect to the extraction plate 101, the ion implantation level and implantation width corresponding to different implantation levels in workpiece 100 may be varied across different areas of the workpiece.

FIG. 5 depicts in a schematic fashion exemplary shapes of a plasma sheath boundary 241 as a function of plasma power. For example, curves 241a, 241b, and 241c may represent a boundary at low, intermediate, and high RF-power in plasma 140, respectively. As power decreases, the boundary 241 develops stronger curvature and extends further towards chamber 402 into a region above extraction plate 101. This change in position and curvature of boundary 241 may act to change the overall distribution of angles of ions accelerated from boundary 241 toward workpiece 100.

Figure 6A:
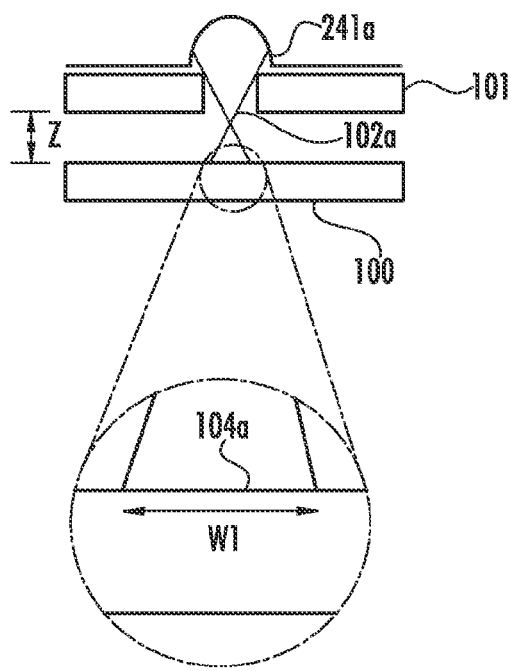
FIGS. 6a-c depict embodiments showing exemplary ion profiles at different plasma power levels.
Figure 6B:
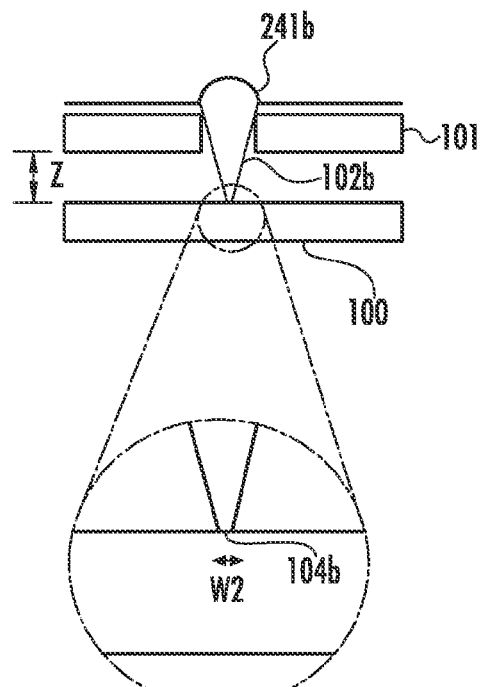
Figure 6C:
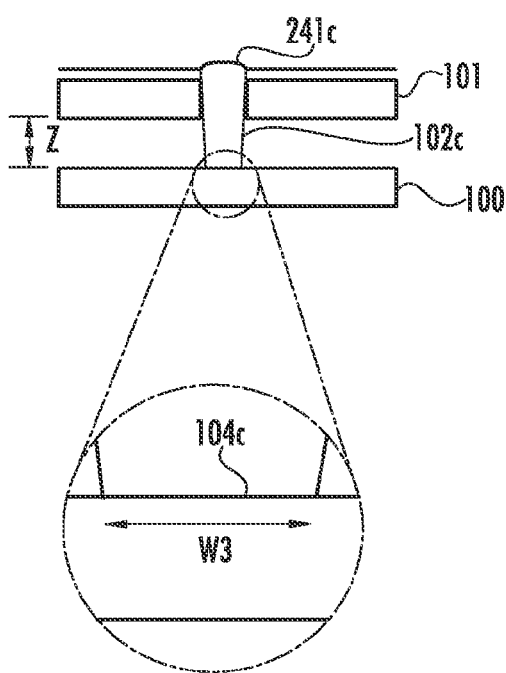

FIGS. 6a-c depict respective exemplary ion profiles 102a-c at different plasma power levels for ions accelerated from a plasma 140 through an extraction plate 101 in accordance with embodiments of the disclosure. As illustrated, the ion profiles 102a, 102b, and 102c, may result from plasma sheath boundaries 241a, 241b, 241c, which correspond to the low, intermediate and high plasma power levels discussed above with respect to FIG. 5. In the low plasma power arrangement, the ions 102a converge to a focal point above the substrate 100 and diverge before striking the substrate. An implanted region 104a is formed having a width W1 at substrate 100. In the intermediate power level arrangement depicted at FIG. 6b, the convergence of ions in ion profile 102b is more gradual than at lower power, such that the "focus plane" (not separately shown) of the ions is about at the level of substrate 100. In this manner, the implanted region 104b defined by ions 102b is much narrower, having a width W2. Finally, at the higher power arrangement, the convergence angle of ions 102c is still less, resulting in an implanted region 102c that has a width W3 that is much larger than W2.

In one example, the power levels of plasma 140 may be arranged such that the implanted width W1 and W3 are equal. Thus, by varying the plasma power in a monotonic fashion from a low power level to a high power level, the focal plane of ions extracted from the plasma may be varied from an overfocused condition, to a focused condition, to an underfocused condition with respect to the plane of substrate 100. In one set of examples, a 0.5 kW plasma may be arranged in conjunction with an extraction plate having an aperture width on the order of 1 mm to produce an overfocused ion beam producing an implant width of about 1 mm at a substrate; a 2.2 kW plasma may be arranged to produce a focused beam having an implant width of about 0.1 mm; and a 5 kW plasma may be arranged to produce an underfocused beam having an implant width of about 1 mm.

This ability to vary the implant width at a substrate by changing plasma power affords the ability to conveniently populate a substrate with regions having different levels of ion implantation and different widths by changing the plasma power while scanning the substrate. In the example above, a 0.5 kW plasma may be used to produce, for example, a blanket or background level of implantation of a dopant species over a substrate using a 1 mm wide beam to scan over wide areas of the substrate. A 2.2 kW plasma may be used to produce selective areas having higher dopant concentration since the ion flux extracted from the 2.2 kW plasma through extraction plate 101 may be substantially higher than that extracted from a 0.5 kW plasma. Moreover, the 2.2 kW setpoint may be convenient for populating narrow stripes of high dopant concentration on the substrate, since the beam width may be about 0.1 mm. Thus, during an implantation process, the substrate 100 may be continuously scanned with respect to extraction plate 101, while the plasma power is varied. This procedure may create one or more narrow substrate regions of relatively higher implantation levels and one or more wider substrate regions having relatively lower implantation levels.

Figure 7A:
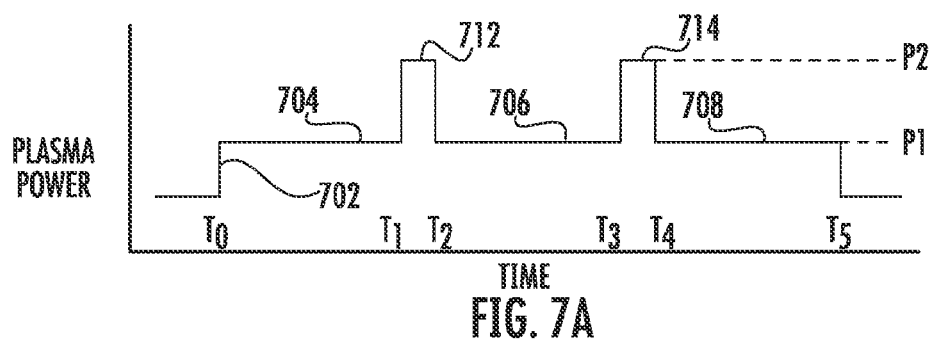
FIGS. 7a and 7b present an exemplary plasma power curve and a resulting substrate implantation pattern according to one embodiment.
Figure 7B:
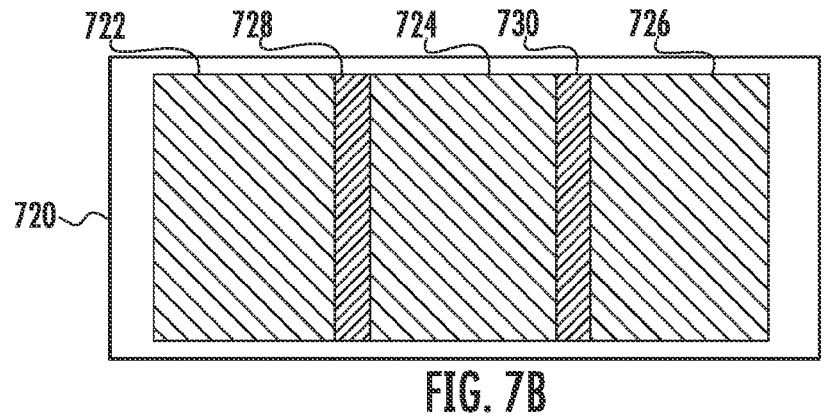

FIGS. 7a and 7b present an exemplary plasma power curve and a resulting substrate implantation pattern according to one embodiment. In this embodiment, plasma power curve 702 represents applied plasma power as a function of time. At an initial time, $T_0$ the plasma may be initiated by applying a power level P1. The power level P1 is maintained until $T_1$, when power is increased to a level P2 for a period of time till $T_2$, after which the power level is reduced to P1. The power level is again increased to P2 between $T_3$ and $T_4$, after which power is maintained at level P1 until being extinguished at $T_5$. In some embodiments, a substrate may be scanned with respect to an extraction plate at a constant velocity when power curve 702 is applied to a plasma adjacent the extraction plate. Accordingly, the abscissa, which depicts time in FIG. 7a, may also be directly proportional to linear position along a substrate that receives ions extracted from an aperture of the extraction plate.

FIG. 7b depicts implantation areas in a workpiece 720 after scanning under an extraction plate while plasma curve 702 is applied. The periods 704, 706, and 708 during which power is maintained at P1, correspond to a first level of ion implantation forming respective wide areas 722, 724, and 726. The periods 712, 714, during which power is at increased level P2, correspond to a second level of ion implantation forming respective areas 728, 730.

Figure 8A:
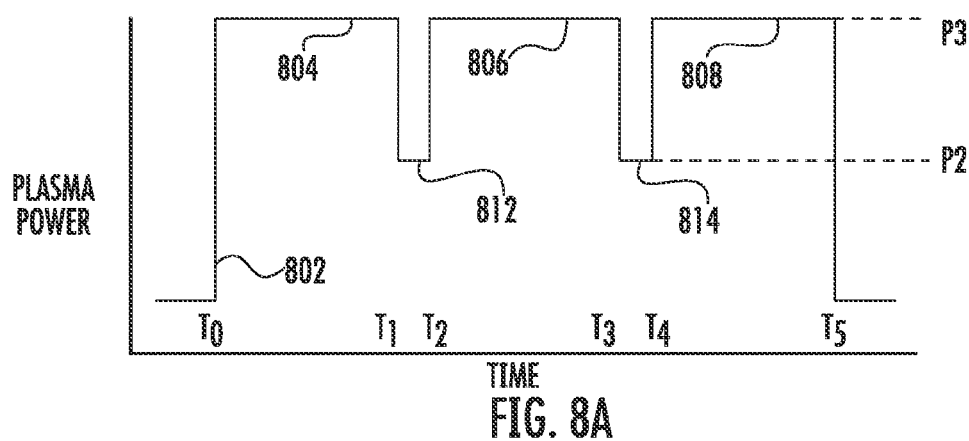
FIGS. 8a and 8b present another exemplary plasma power curve and a resulting substrate implantation pattern according to another embodiment.
Figure 8B:
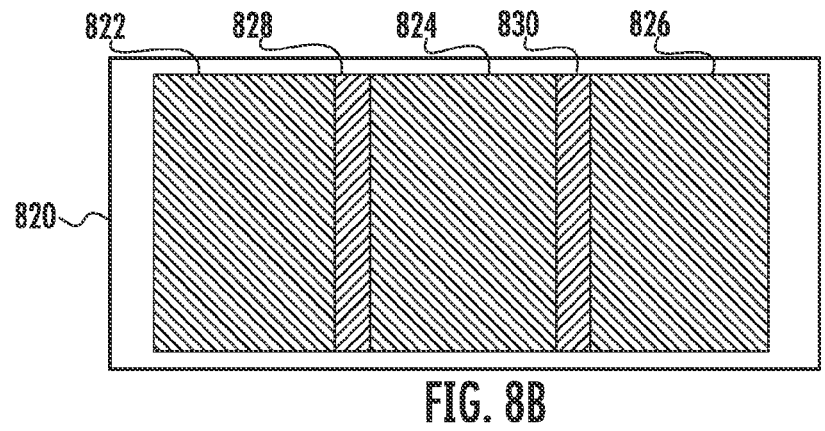

FIGS. 8a and 8b present another exemplary plasma power curve 802 and a resulting substrate implantation pattern according to another embodiment. At an initial time $T_0$ the plasma may be initiated by applying a power level P3. The power level P3 is maintained until $T_1$, when power is decreased to a level P2 for a period of time until $T_2$, after which the power level is increased to P3. The power level is again decreased to P2 between $T_3$ and $T_4$, after which power is maintained at level P3 until being extinguished at $T_5$.

As illustrated in FIG. 8b, the periods 804, 806, and 808 during which power is maintained at P3, correspond to a third level of ion implantation forming respective areas 822, 824, and 826 of workpiece 820. The periods 810, 812, in which power is decreased to P2, may correspond to a level of ion implantation similar to that in regions 728, 730, thereby forming respective areas 828, 830.

In various embodiments of plasma power curves 702, 802 of FIGS. 7a and 8a, the power level P2 may correspond to a power in which an extraction plate produces an ion beam having a smaller beam width (and therefore having a smaller implantation width in the workpiece) than at power levels P1 or P3. In some embodiments, the power level P2 may produce an ion beam whose focus plane (that is, the plane in which the beam width is a minimum) is coincident with the substrate plane. Accordingly, whenever a plasma power set point corresponding to P2 is sent to the power source, a minimum beam width may be produced at the substrate.

Thus, using a plasma power set point corresponding to P2 provides the ability to both selectively change the implantation level in areas 728, 730 and 828, 830 and to decrease the minimum size of an area that can be patterned by the selective ion implantation. In the example of plasma power curve 702, the larger areas 722-726 are patterned using a lower power level P1, which creates a wider, unfocused beam at the workpiece that may result in more uniform implantation. In the example of plasma power curve 802, the larger areas 822-826 are patterned using a higher power level P3, which may also produce a wider, unfocused beam at the workpiece. In the latter case, however, the level of ion implantation in the larger areas 822-826 may be higher as compared to areas 722-726, due to the greater plasma power.

Accordingly, the present embodiments provide a system and method to conveniently pattern a workpiece with multiple areas of differing implantation levels. The multiple areas may be produced in a single continuous scan of a workpiece without the need for masking. Relatively narrower implantation areas may be interspersed between wider, relatively uniform implantation areas by either increasing or decreasing plasma power, depending on the desired power level to be used for implanting the wide areas and the power level corresponding to a focused beam.

In various embodiments, a continuous DC bias may be applied between a workpiece and plasma while the workpiece is scanned with respect to an extraction plate and while the power level to the plasma is simultaneously varied between different power setpoints during the scanning. By using continuous DC bias, the uniformity of implanted areas may be improved. However, in some embodiments, pulsed DC biasing between workpiece and plasma may be used.

Although in some embodiments, pulsed DC biasing between substrate and plasma may be performed without synchronization with variation in plasma power setpoints, in other embodiments, one or more aspects of the pulsed DC biasing may be synchronized with one or more aspects of a plasma power recipe. In some embodiments, DC pulses may be synchronized with changes in power levels of the plasma, wherein a transition between a first and second power level in the plasma takes place during an off period of the pulsed DC voltage. This has the effect of preventing ion implantation during a transition between different beam sizes and power levels, during which time the plasma is changing.

Figure 9A:
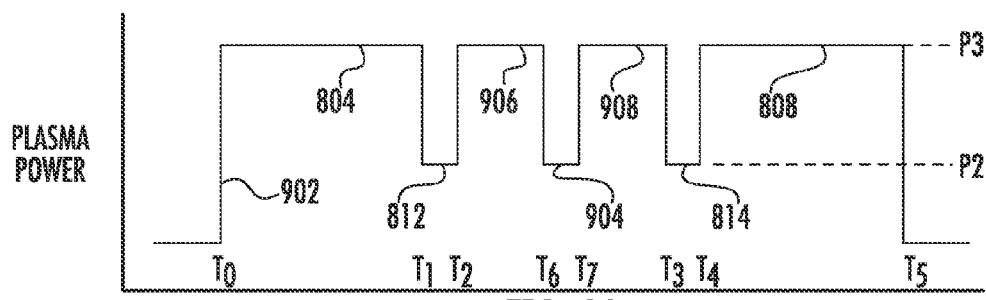
FIGS. 9a-9c illustrate, respectively, an exemplary plasma power curve, synchronized DC extraction voltage curve, and resulting substrate implantation pattern according to an embodiment.
Figure 9B:
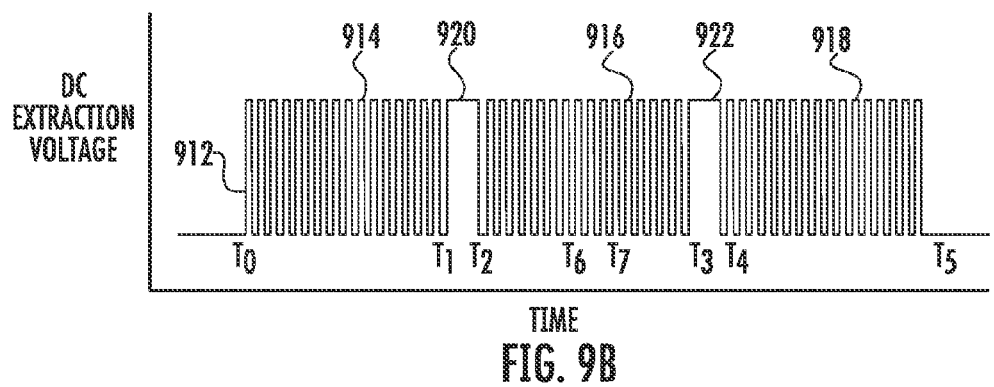
Figure 9C:
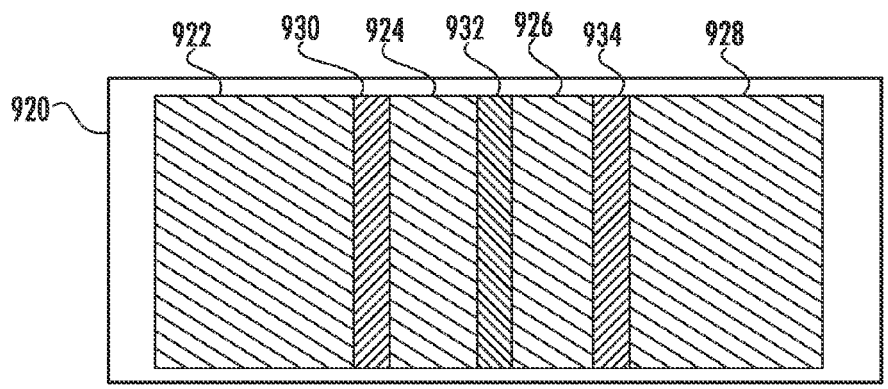

In other embodiments, the DC pulsing protocol may be adjusted according to the plasma power setpoint. FIG. 9a illustrates an exemplary plasma power curve which embodies a recipe for periodically changing the power between two setpoints. FIG. 9b depicts an exemplary DC extraction voltage curve that may be synchronized in time with the plasma power curve, and FIG. 9c shows a resulting substrate implantation pattern that may be produced according to the synchronization of plasma power and DC extraction voltage depicted in FIGS. 9a and 9b. Plasma power curve 902 is similar to curve 802, except that an extra period 904 is added in which power is lowered to level P2, resulting in period 806 being sub-divided into high plasma power periods 906 and 908. FIG. 9b depicts an extraction voltage curve 912 in which DC voltage between plasma and substrate is applied in a series of pulses or groups of pulses 914-922. The voltage may be pulsed between a fixed voltage and zero voltage. For example, if a 30 keV ion implantation energy is desired, the voltage of curve 912 may be pulsed between an off state of 0 V and on state of 30 kV. The voltage pulse period may be in the kilohertz range or greater. Thus, during a scan of a 100 cm long workpiece at a velocity on the order of 1 cm/sec, many thousands of pulses may take place.

As depicted in FIGS. 9a and 9b, the high plasma power setpoint periods (P3) 804, 906, 908, and 808 are synchronized with periods of narrow voltage pulses 914, 916, and 918, in which the "on" period (which may represent 30 kV substrate bias) may be microseconds up to hundreds of microseconds. The duty cycle of such pulses may be any convenient value according to a desired implantation level, such as 5%, 10%, or 50%. In addition, periods 812 and 814 in which the plasma power setpoint P2 is lower, are synchronized with respective DC extraction voltage pulses 920 and 922. The voltage "pulses" 920 and 922 may actually represent continuously applied extraction voltage (for example, 30 kV) during the entire low plasma power (P2) periods between $T_1$ and $T_2$ and between $T_3$ and $T_4$. Following the example of a 1 cm/sec scan rate, if lower power set point P2 produces a 0.1 mm beam and the intended implantation width is 0.2 mm, the width of "pulses" 920 and 922 may be about 20 msec, while the width of pulses 914-918 may be on the order of 10-100 μsec.

The synchronization of DC extraction voltage and plasma power levels illustrated in FIGS. 9a and 9b may facilitate better control of ion dose in the high plasma power and low plasma power regions. For example, as discussed above, the use of power level P3 may produce a beam having a larger beam width suitable for large area patterning. The use of a larger beam width may reduce the tendency for "striping" that may occur when narrower beams are pulsed on and off. In addition, the exact implant dose in the larger areas may be conveniently adjusted by adjusting upwardly or downwardly the duty cycle of pulses 914, 916, 918. Moreover, by providing a continuous extraction voltage (the aforementioned "pulses" 920 and 922) in short periods 812, 814 where the plasma power level is at P2, a relatively higher dose of ions may be implanted during the shorter periods. As noted above, the beam width corresponding to power level P2 may be on the order of 0.1 mm, allowing narrow implant regions to be formed. By providing a higher duty cycle (that is, 100% in the example shown) of DC extraction voltage for the narrow periods 812 and 814, a higher implant dose may result, even though the overall plasma power is lower than for periods 804 and 808, for example.

FIG. 9c illustrates one embodiment of a substrate that may result from the exemplary plasma power and DC extraction recipes 902 and 912, respectively. Substrate 920 contains several wide regions 922, 924, 926, and 928 corresponding to high plasma power levels P3 that are mutually separated by narrow regions 930, 932, and 934. In the example shown, narrow regions 930 and 934 are similar to one another, and may contain relatively higher implant levels resulting from the fact that a continuous DC extraction voltage is applied between respective periods $T_4$-$T_2$ and $T_3$-$T_4$. On the other hand, narrow region 932, corresponding to lower plasma power period between $T_6$ and $T_7$, may have a lower implant level, due to the fact that the pulsed DC voltage (with less than 100% duty cycle) is applied during the entire period between $T_6$ and $T_7$.

In some embodiments, workpieces such as workpieces 720, 820, 920, may be implanted solar cells. By controlling plasma power and DC extraction voltage pulsing, the width and dose in selectively implanted areas of a solar cell can be tailored using a continuous scan process. As compared to processes employing physical masks and/or lithography steps to form patterned implantation, the present embodiments provide a simpler and more efficient manner of doping solar cells or other substrates requiring areas of different implantation levels including narrow widths. In particular, one or more narrow implant regions using a narrow ion beam width may be populated between wider implant regions using a wider implant beam width during a single scan at a constant scan rate in which the implantation levels of narrow and wide implant regions may be each be adjusted by adjusting pulsed biasing of the substrate. None of the aforementioned embodiments require mechanical adjustments such as changing physical aperture sizes, changing scan rates, separation distance between extraction plate and substrate, or other mechanical adjustments that may be cumbersome and decrease reliability.

The methods described herein may be automated by, for example, tangibly embodying a program of instructions upon a computer readable storage media capable of being read by machine capable of executing the instructions. A general purpose computer is one example of such a machine. A non-limiting exemplary list of appropriate storage media well known in the art includes such devices as a readable or writeable CD, flash memory chips (e.g., thumb drives), various magnetic storage media, and the like.

In particular, steps for varying the plasma power setpoint and the steps for varying the DC extraction voltage may be performed at least partially by a combination of an electronic processor, computer readable memory, and/or computer readable program. The computer memory may be further configured to receive, display and store process history information associated with operation of a plasma system and as exemplified by the stored voltage values.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. In particular, embodiments in which the plasma power is varied between more than two setpoints corresponding to more than two different power levels are possible. Moreover, embodiments in which the plasma power is pulsed rather than continuous are also possible. In addition, embodiments are contemplated in which changes in scan rates are combined with changes in any of the aforementioned parameters, such as substrate pulsed biasing and plasma power setpoint changes.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A method of implanting a workpiece in an ion implantation system, comprising:
   providing an extraction plate adjacent to a plasma chamber containing a plasma, the extraction plate configured to provide an ion beam having ions distributed over a range of angles of incidence on less than an entirety of a surface of the workpiece facing the extraction plate;
   scanning the workpiece with respect to the extraction plate; and
   varying a power level of the plasma during the scanning from a first power level to a second power level, wherein at the surface of the workpiece, a first beam width at the first power level is greater than a second beam width at the second power level;
   wherein an extraction voltage is applied as pulses between the plasma and workpiece;
   wherein a first duty cycle of the extraction voltage pulses is applied during periods when the first power level of the plasma is applied; and
   wherein a second duty cycle of the extraction voltage pulses is applied during periods when the second power level of the plasma is applied, the second duty cycle being different than the first duty cycle.

2. The method of claim 1, wherein the varying the power level creates a plurality of implanted regions in the workpiece, at least one region of the plurality of implanted regions having a different ion implantation level than another region in the workpiece.

3. The method of claim 1, comprising applying the first power level for a first duration corresponding to a first implanted region width and applying the second power level for a second duration corresponding to a second implanted region width.

4. The method of claim 3, comprising periodically alternating the power level of the plasma between the first and second power levels a multiplicity of times.

5. The method of claim 1, the first power level being higher than the second power level.

6. The method of claim 1, the first power level being less than the second power level.

7. The method of claim 1, comprising varying the power level of the plasma during the scanning to a third power level, wherein at the surface of the workpiece, a third beam width at the third power level is different from the first and the second beam widths.

8. The method of claim 1, comprising synchronizing the applied extraction voltage with changes in the power level of the plasma, wherein a transition between the first and second power levels takes place during an off period of the pulsed extraction voltage.

9. The method of claim 1, comprising:
   setting a first pulse width for the on period of the first duty cycle;
   and setting a second pulse width for the on period of the second duty cycle.

10. The method of claim 1, wherein the varying the power level creates a plurality of implanted regions in the workpiece and the ion beam converges to the plurality of implanted regions.

11. The method of claim 10, wherein at least one region of the plurality of implanted regions has a different ion implantation level than another region of the plurality of implanted regions.

12. The method of claim 1, wherein the ion beam is focused over less than the entirety of the surface of the workpiece facing the extraction plate.

13. The method of claim 12, wherein varying the power level creates a plurality of implanted regions in the workpiece, at least one region of the plurality of implanted regions having a different ion implantation level than another region of the plurality of implanted regions.

14. The method of claim 1, further comprising switching from the first duty cycle to the second duty cycle to achieve a higher implant dose, wherein the second duty cycle is higher than the first duty cycle.

15. The method of claim 1, further comprising switching from the first duty cycle to the second duty cycle to achieve a lower implant dose, wherein the second duty cycle is lower than the first duty cycle.

16. An article, comprising a computer-readable storage device containing instructions that if executed by a processor enable an ion implantation system to:
    scan a workpiece holder with respect to an extraction plate arranged to extract ions from a plasma through at least one aperture that provides an ion beam towards the workpiece;
    apply an extraction voltage between the plasma and workpiece; and
    vary a power level of the plasma during the scan while maintaining the first scan rate to vary a width of the ion beam directed toward less than an entirety of a surface of the workpiece facing the extraction plate;
    wherein the extraction voltage is applied as pulses between the plasma and workpiece;
    wherein a first duty cycle of the extraction voltage pulses is applied during periods when the first power level of the plasma is applied; and
    wherein a second duty cycle of the extraction voltage pulses is applied during periods when the second power level of the plasma is applied, the second duty cycle being different than the first duty cycle.

17. The article of claim 16, comprising a computer-readable storage device containing instructions that if executed by a processor enable an ion implantation system to:
    apply the extraction voltage comprising on and off periods, wherein no extraction voltage is applied between the plasma and workpiece during the off periods; and
    synchronize a transition between a first power level and a second power level of the plasma with the off periods of the extraction voltage.

18. The article of claim 16, wherein the ion implantation system is further enabled to switch from the first duty cycle to the second duty cycle to achieve a higher implant dose, wherein the second duty cycle is higher than the first duty cycle.

19. The article of claim 16, wherein the ion implantation system is further enabled to switch from the first duty cycle to the second duty cycle to achieve a lower implant dose, wherein the second duty cycle is lower than the first duty cycle.

* * * * *